(12) United States Patent
Guo

(10) Patent No.: US 11,650,872 B2
(45) Date of Patent: May 16, 2023

(54) SYSTEM AND METHOD FOR MONITORING CODE OVERWRITE ERROR OF REDRIVER CHIP

(71) Applicant: INSPUR SUZHOU INTELLIGENT TECHNOLOGY CO., LTD., Jiangsu (CN)

(72) Inventor: Xiaoyu Guo, Jiangsu (CN)

(73) Assignee: INSPUR SUZHOU INTELLIGENT TECHNOLOGY CO., LTD., Jiangsu (CN)

( * ) Notice: Subject to any disclaimer, the term of this patent is extended or adjusted under 35 U.S.C. 154(b) by 0 days.

(21) Appl. No.: 17/780,351

(22) PCT Filed: Sep. 28, 2020

(86) PCT No.: PCT/CN2020/118306
§ 371 (c)(1),
(2) Date: May 26, 2022

(87) PCT Pub. No.: WO2021/169284
PCT Pub. Date: Sep. 2, 2021

(65) Prior Publication Data
US 2023/0008753 A1 Jan. 12, 2023

(30) Foreign Application Priority Data
Feb. 29, 2020 (CN) .......................... 202010132976.X

(51) Int. Cl.
*G06F 11/00* (2006.01)
*G06F 11/07* (2006.01)
*H03K 19/017* (2006.01)

(52) U.S. Cl.
CPC ...... *G06F 11/0772* (2013.01); *G06F 11/0787* (2013.01); *H03K 19/01721* (2013.01)

(58) Field of Classification Search
None
See application file for complete search history.

(56) References Cited

U.S. PATENT DOCUMENTS 9,692,589 B2 * 6/2017 Iyer .......................... H04L 1/241
10,812,067 B1 * 10/2020 Delshadpour ....... H04L 25/0298
(Continued)

FOREIGN PATENT DOCUMENTS

| CN | 1912858 A | 2/2007 |
|---|---|---|
| CN | 102915287 A | 2/2013 |

(Continued)

OTHER PUBLICATIONS

Google Scholar/Patents search—text refined (Year: 2022).*
(Continued)

*Primary Examiner* — Christopher S McCarthy
(74) *Attorney, Agent, or Firm* — Cooper Legal Group, LLC

(57) ABSTRACT

A system and method for monitoring a code overwrite error of a Redriver chip are disclosed. An analog to digital converter (ADC) monitors whether an EEPROM code of a Redriver chip has been overwritten in error. A Switch chip is utilized to separate the Redriver chip from a system management bus (SMbus) controller. A pull-up resistor keeps an SMbus at a Redriver chip/EEPROM side in a pull-up state. The ADC is utilized to monitor the SMbus. When an abnormal low level is monitored, an alarm signal is sent to the SMbus controller to give a risk alarm for an overwrite error. In addition, according to different ADC sampling rates, an SMbus may also be connected between the SMbus controller and an ADC with a high sampling rate, whereby SMbus data can be monitored.

9 Claims, 1 Drawing Sheet

(56) References Cited

U.S. PATENT DOCUMENTS

2012/0311359 A1* 12/2012 Jaramillo ............ H04L 25/0298
            713/321
2014/0049265 A1*  2/2014 Oh ....................... G01R 31/003
            324/555
2020/0409444 A1* 12/2020 Delshadpour ....... H04L 25/0298

FOREIGN PATENT DOCUMENTS

| CN | 104978251  | A  | 10/2015 |
| CN | 106325850  | A  | 1/2017  |
| CN | 106325919  | A  | 1/2017  |
| CN | 107039086  | A  | 8/2017  |
| CN | 107729173  | A  | 2/2018  |
| CN | 207232938  | U  | 4/2018  |
| CN | 108984365  | A  | 12/2018 |
| CN | 109379110  | A  | 2/2019  |
| CN | 109658887  | A  | 4/2019  |
| CN | 111352876  | A  | 6/2020  |
| WO | 2017014876 | A1 | 1/2017  |

OTHER PUBLICATIONS

International Search Report of corresponding PCT application PCT/CN2020/118306, dated Jan. 4, 2021, 5 pages.
Written Opinion of International Searching Authority of corresponding PCT application PCT/CN2020/118306, dated Jan. 4, 2021, 9 pages.
First Office Action of corresponding CN priority application CN202010132976.X, dated Jan. 28, 2021, 6 pages.

* cited by examiner

SYSTEM AND METHOD FOR MONITORING CODE OVERWRITE ERROR OF REDRIVER CHIP

This application claims priority to Chinese Patent Application No. 202010132976.X, filed to China Patent Office on Feb. 29, 2020 and entitled "System and Method for Monitoring Code Overwrite Error of Redriver Chip", which is hereby incorporated by reference in its entirety.

FIELD

The present application relates to the technical field of signal transmission, in particular to a system and method for monitoring a code overwrite error of a Redriver chip.

BACKGROUND

In the field of servers, a CPU is required to perform frequent information exchange with devices such as terminal hard disks, and protocols such as PCIe/SATA/SAS are all common high-speed signal transmission protocols. However, for some server products of larger sizes, there may be a problem of signal quality degradation due to an extra long link caused by a long distance between the CPU and the hard disk device. There are two common solutions in the industry: signal quality enhancement using Redriver chips and signal quality enhancement using Retimer. The Redriver does not need a reference clock, a designer is only required to set corresponding parameters to achieve signal quality enhancement, and the hardware design is relatively simple.

There are three parameter setting modes for Redriver chips: Pin mode, system management bus (SMbus) mode and EEPROM mode. In the Pin mode, parameters are set by external pull-up and pull-down. The SMbus mode is controlled by a host side via an SMbus. In the EEPROM mode, required parameters are burnt in an EEPROM code. Each time a Redriver chip is powered on, the respective parameter information is loaded from the EEPROM. A plurality of Redriver chips may be configured by using the EEPROM at the same time, and an additional controller is not required for control, whereby the application is relatively wide.

However, when the Redriver chip is configured by using the EEPROM, the Redriver chip will be connected to a controller due to some requirements of debugging or remote upgrade of the EEPROM code, whereby the configuration is facilitated by the SMbus, and the SMbus mode and the EEPROM mode may be compatible with each other. After each power-on, the Redriver chip, as an SMbus Master mode, will be automatically converted into an SMbus Slave mode after loading parameter information from the EEPROM. At this moment, the system controller can configure Redriver. Therefore, after a period of power-on, the SMbus controller of the system cannot configure Redriver. However, due to the lack of an SMbus monitoring mechanism in the normal operating state of the system, there is a risk that the system controller overwrites the EEPROM or Redriver in error.

SUMMARY

The object of the present application is to provide a system and method for monitoring a code overwrite error of a Redriver chip, intended to solve the problem in the prior art that there is a risk that a system controller overwrites an EEPROM or Redriver in error due to the lack of an SMbus monitoring mechanism, thus monitoring the risk of overwrite error in real time and improving the reliability of SMbus data.

In order to achieve the above technical object, the present application provides a system for monitoring a code overwrite error of a Redriver chip. The system has the following specific structures:

the Redriver chip is connected to an EEPROM via an SMbus;

the Redriver chip is connected to an SMbus controller together with the EEPROM via a Switch chip, and a pull-up resistor is arranged between the SMbus and the Switch chip; and the SMbus is further connected with an analog to digital converter (ADC), and an SMbus voltage is monitored by the ADC.

Preferably, the SMbus is in a high-level state during turn-off of the Switch chip.

Preferably, a monitoring voltage of the ADC ranges from 2.8 V to 3.5 V.

Preferably, the SMbus controller and the ADC are also connected via the SMbus, and SMbus data is monitored by the ADC.

The present application also provides a method for monitoring a code overwrite error of a Redriver chip, implemented using the system. The method includes the following operations:

setting the Redriver chip as an SMbus mode via a pin, loading parameter information from the EEPROM by the Redriver chip after the system is powered on, and converting the Redriver chip into an SMbus Slave mode; and when the Switch chip is in an off state, pulling the SMbus up to a high level, collecting an abnormal level by the ADC, and sending an alarm signal; and sending, by the Redriver chip, an ALL_DONE signal to the SMbus controller, sending, by the SMbus controller, an enable signal to the Switch chip to turn Switch on, performing, by the SMbus controller, data access to the Redriver chip and the EEPROM, and masking the alarm signal of the ADC.

Preferably, alarm information sent by the ADC, masked by the SMbus controller, is recorded in a system log during turn-on of the Switch chip.

Preferably, the SMbus controller forcibly turns the Switch chip off after receiving an alarm signal during turn-off of the Switch chip.

Preferably, when the SMbus controller and the ADC are connected via the SMbus, the Switch chip loads ADC sampling data in real time via the SMbus during turn-off after the SMbus controller receives an alarm signal, and the data is parsed and then recorded in the system log.

The effects provided in the SUMMARY section are only the effects of embodiments, not all the effects of the present application. One of the above technical solutions has the following advantages or beneficial effects:

Compared with the prior art, according to the present application, an ADC monitors whether an EEPROM code of a Redriver chip has been overwritten in error. A Switch chip is utilized to separate the Redriver chip from an SMbus controller. A pull-up resistor keeps an SMbus at a Redriver chip/EEPROM side in a pull-up state. The ADC is utilized to monitor the SMbus. When an abnormal low level is monitored, an alarm signal is sent to the SMbus controller to give a risk alarm for an overwrite error. In addition, according to different ADC sampling rates, an SMbus may also be connected between the SMbus controller and an ADC with a high sampling rate, whereby SMbus data can be monitored.

The above description is merely an overview of the technical solution of the present application, which may be implemented in accordance with the contents of the specification in order to make the technical means of the present application more clearly understood, and specific implementations of the present application will be described below in order to make the above and other objects, features and advantages of the present application more apparent and understandable.

BRIEF DESCRIPTION OF THE DRAWINGS

Various other advantages and benefits will become apparent to those ordinarily skilled in the art upon reading the following detailed description of preferred implementations. The drawings are only for purposes of illustrating the preferred implementations and are not to be construed as limiting the present application. Moreover, like reference numerals represent like components throughout the drawings. In the drawings.

DETAILED DESCRIPTION

Exemplary embodiments of the present disclosure will be described in more detail below with reference to the drawings. While the drawings show exemplary embodiments of the present disclosure, it should be understood that the present disclosure may be embodied in various forms and should not be construed as limited to the embodiments set forth herein. Rather, these embodiments are provided whereby the present disclosure will be understood thoroughly, and the scope of the present disclosure will be completely conveyed to those skilled in the art.

A system and method for monitoring a code overwrite error of a Redriver chip provided in an embodiment of the present application will now be described in detail with reference to the drawings.

Embodiment 1

Figure 1:
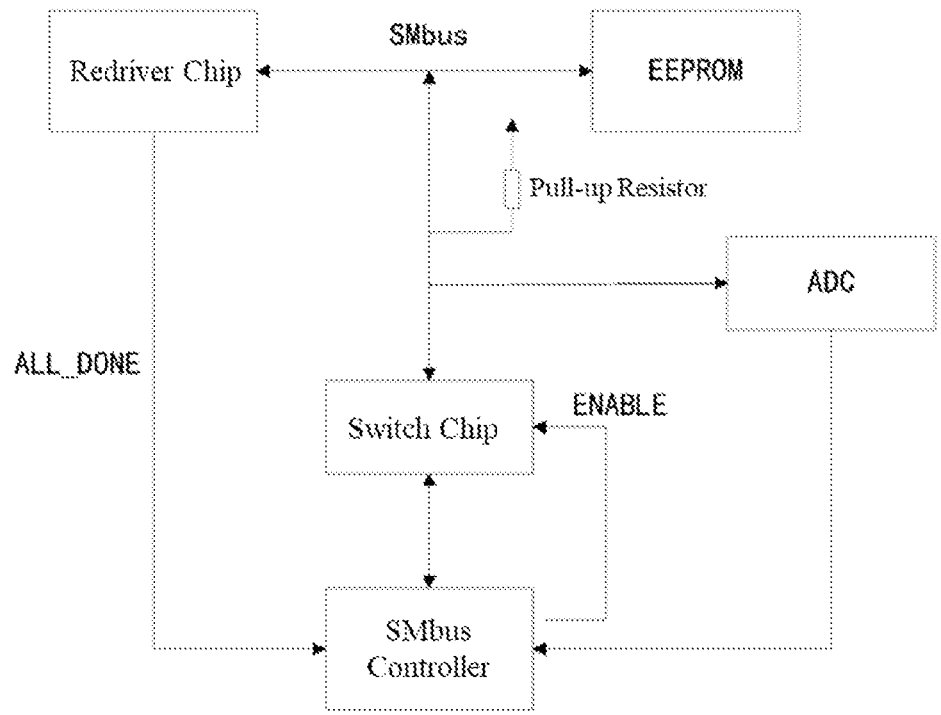
FIG. 1 is a block diagram of a system for monitoring a code overwrite error of a Redriver chip provided in an embodiment of the present application.

As shown in FIG. 1, the present application discloses a system for monitoring a code overwrite error of a Redriver chip. The system has the following specific structures.

The Redriver chip is connected to an EEPROM via an SMbus.

The Redriver chip is connected to an SMbus controller together with the EEPROM via a Switch chip, and a pull-up resistor is arranged between the SMbus and the Switch chip.

The SMbus is further connected with an ADC, and an SMbus voltage is monitored by the ADC.

In the embodiments of the present application, an ADC monitors whether an EEPROM code of a Redriver chip has been overwritten in error. A Switch chip is utilized to separate the Redriver chip from an SMbus controller. An SMbus at a Redriver chip/EEPROM side is kept in a pull-up state. The ADC monitors the SMbus. When an abnormal low level is detected, an alarm signal is sent to the SMbus controller to remind the Redriver chip of a risk of overwrite error.

According to a design line shown in FIG. 1, the Redriver chip and the EEPROM are connected via the SMbus, and are connected together to the SMbus controller via the Switch chip. The Switch chip is in an off state by default. The SMbus is pulled up to 3.3 V between the Switch chip and the SMbus.

The Redriver chip is set as an SMbus mode via a pin, and a normal monitoring voltage of the ADC ranges from 2.8 V to 3.5 V. After the system is powered on, the Redriver chip loads parameter information from the EEPROM via the SMbus, and sends an ALL_DONE signal to the SMbus controller after the loading is finished, and the Redriver chip is converted into an SMbus Slave mode. The SMbus controller does not allow the Switch chip to be turned on before receiving the ALL_DONE signal to avoid bus contention. The SMbus is pulled up to a high level during turn-off of the Switch chip, and the ADC starts to monitor an SMbus data line voltage. When an abnormal voltage is monitored, the controller will be alarmed via an alarm signal.

After receiving the ALL_DONE signal, the SMbus controller may turn the Switch chip on by sending an Enable signal according to system requirements, access data in the Redriver chip and the EEPROM, and read/write the data. When the SMbus controller receives the system requirements to turn the Switch chip on, the SMbus controller masks alarm information sent by the ADC, which is still recorded in a system log. In other cases, the SMbus controller forcibly turns the Switch chip off after receiving an alarm signal, and the alarm signal is recorded in the system log.

An embodiment of the present application also discloses a method for monitoring a code overwrite error of a Redriver chip. The method includes the following operations.

The Redriver chip is set as an SMbus mode via a pin, the Redriver chip loads parameter information from the EEPROM after the system is powered on, and the Redriver chip is converted into an SMbus Slave mode.

When the Switch chip is in an off state, the SMbus is pulled up to a high level, and the ADC collects an abnormal level and sends an alarm signal.

The Redriver chip sends an ALL_DONE signal to the SMbus controller, the SMbus controller sends an enable signal to the Switch chip to turn Switch on, and the SMbus controller performs data access to the Redriver chip and the EEPROM, and masks the alarm signal of the ADC.

Embodiment 2

Figure 2:
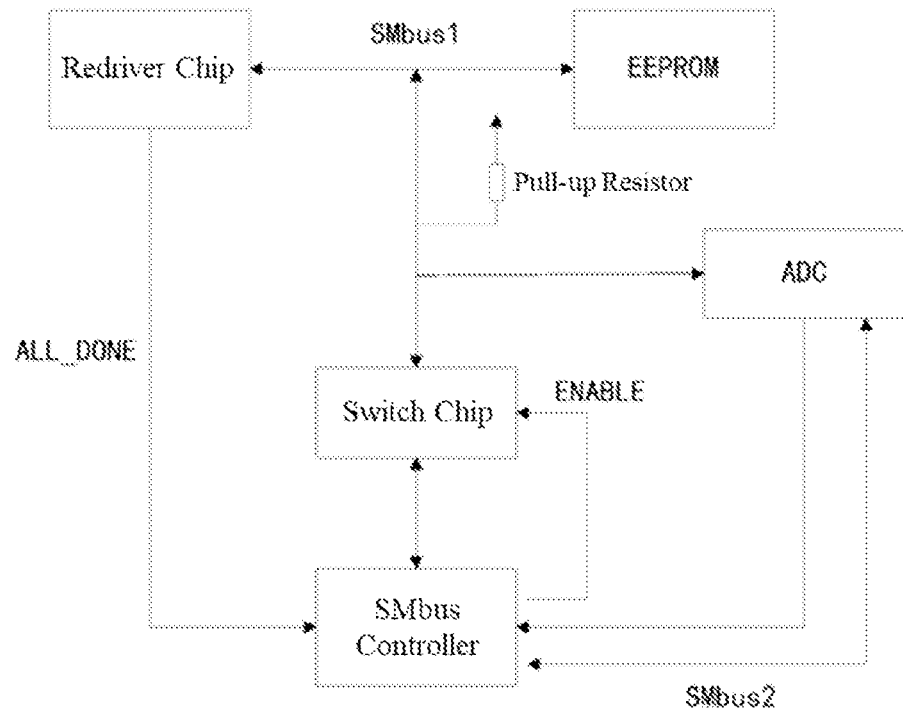
FIG. 2 is a block diagram of a system for monitoring a code overwrite error of a Redriver chip using an ADC with a high sampling rate provided in an embodiment of the present application.

As shown in FIG. 2, the present application discloses a system for monitoring a code overwrite error of a Redriver chip. The system has the following specific structures.

A Redriver chip is connected to an EEPROM via SMbus 1.

The Redriver chip is connected to an SMbus controller together with the EEPROM via a Switch chip, and a pull-up resistor is arranged between the SMbus and the Switch chip.

The SMbus is further connected with an ADC, and an SMbus voltage is monitored by the ADC.

The SMbus controller and the ADC are connected via SMbus2.

In the embodiment of the present application, an ADC monitors whether an EEPROM code of a Redriver chip has been overwritten in error. A Switch chip is utilized to separate the Redriver chip from an SMbus controller. An SMbus at a Redriver chip/EEPROM side is kept in a pull-up state. The ADC monitors the SMbus. When an abnormal low level is detected, an alarm signal is sent to the SMbus controller to remind the Redriver chip of a risk of overwrite error.

According to a design line shown in FIG. 2, the Redriver chip and the EEPROM are connected via SMbus1, and are connected together to the SMbus controller via the Switch chip. The Switch chip is in an off state by default. The SMbus is pulled up to 3.3 V between the Switch chip and the SMbus.

Since the SMbus data may be monitored when the sampling rate of the ADC is sufficiently high, SMbus2 is connected between the SMbus controller and an ADC with a high sampling rate, and the SMbus controller may read the monitored data from the ADC in real time via SMbus2 and parse the data, whereby SMbus1 data can be monitored, and the sampling frequency of the ADC is at least twice the rate of SMbus1 at this moment. In the present embodiment, the SMbus controller is connected to an ADC with a high sampling rate via SMbus2, and pulled up to 3.3 V. The rate of SMbus1 is 100 K/S, the rate of SMbus2 is 400 K/S, and the sampling rate of the ADC is designed to be 400 KHz.

The Redriver chip is set as an SMbus mode via a pin, and a normal monitoring voltage of the ADC ranges from 2.8 V to 3.5 V. After the system is powered on, the Redriver chip loads parameter information from the EEPROM via the SMbus, and sends an ALL_DONE signal to the SMbus controller after the loading is finished, and the Redriver chip is converted into an SMbus Slave mode. The SMbus controller does not allow the Switch chip to be turned on before receiving the ALL_DONE signal to avoid bus contention. The SMbus is pulled up to a high level during turn-off of the Switch chip, and the ADC starts to monitor SMbus data and CLOCK (CLK) voltage. When an abnormal voltage is monitored, the controller will be alarmed via an alarm signal.

After receiving the ALL_DONE signal, the SMbus controller may turn the Switch chip on by sending an Enable signal according to system requirements, access data in the Redriver chip and the EEPROM, and read/write the data. When the SMbus controller receives the system requirements to turn the Switch chip on, the SMbus controller masks alarm information sent by the ADC, which is still recorded in a system log. In other cases, after receiving an alarm signal, the SMbus controller loads ADC sampling data in real time via SMbus2, and the data is recorded in a system log after being parsed.

An embodiment of the present application also discloses a method for monitoring a code overwrite error of a Redriver chip. The method includes the following operations.

The Redriver chip is set as an SMbus mode via a pin, the Redriver chip loads parameter information from the EEPROM after the system is powered on, and the Redriver chip is converted into an SMbus Slave mode.

When the Switch chip is in an off state, the SMbus is pulled up to a high level, and the ADC collects an abnormal level and sends an alarm signal.

The Redriver chip sends an ALL_DONE signal to the SMbus controller, the SMbus controller sends an enable signal to the Switch chip to turn Switch on, and the SMbus controller performs data access to the Redriver chip and the EEPROM, and masks the alarm signal of the ADC.

As described above, by means of the system for monitoring a code overwrite error of a Redriver chip in Embodiments 1 and 2, an ADC monitors whether an EEPROM code of a Redriver chip has been overwritten in error. A Switch chip is utilized to separate the Redriver chip from an SMbus controller. A pull-up resistor keeps an SMbus at a Redriver chip/EEPROM side in a pull-up state. The ADC is utilized to monitor the SMbus. When an abnormal low level is monitored, an alarm signal is sent to the SMbus controller to give a risk alarm for an overwrite error. In addition, according to different ADC sampling rates, an SMbus may also be connected between the SMbus controller and an ADC with a high sampling rate, whereby SMbus data can be monitored.

The above descriptions are merely preferred embodiments of the present application, and are not intended to limit the present application. Any modification, equivalent substitution or improvement made within the spirit and principles of the present application should be included within the protection scope of the present application.

What is claimed is:

1. A system for monitoring a code overwrite error of a Redriver chip, comprising:
   the Redriver chip is connected to an EEPROM via a system management bus (SM bus);
   the Redriver chip is connected to an SMbus controller together with the EEPROM via a Switch chip, and a pull-up resistor is arranged between the SM bus and the Switch chip; and
   the SMbus is further connected with an analog to digital converter (ADC), an SMbus voltage is monitored by the ADC, and when the SMbus voltage is at a low level, the Redriver chip has a code overwrite error.

2. The system for monitoring a code overwrite error of a Redriver chip according to claim 1, wherein the SMbus is in a high-level state during turn-off of the Switch chip.

3. The system for monitoring a code overwrite error of a Redriver chip according to claim 1, wherein a monitoring voltage of the ADC ranges from 2.8 V to 3.5 V.

4. The system for monitoring a code overwrite error of a Redriver chip according to claim 1, wherein the SMbus controller and the ADC are also connected via the SM bus, and SMbus data is monitored by the ADC.

5. A method for monitoring a code overwrite error of a Redriver chip, implemented using the system according to claim 1, comprising:
   setting the Redriver chip as an SMbus mode via a pin, loading parameter information from the EEPROM by the Redriver chip after the system is powered on, and converting the Redriver chip into an SMbus Slave mode; and
   when the Switch chip is in an off state, pulling the SMbus up to a high level, collecting the SMbus voltage by the ADC, a low level of the SM bus voltage indicating code overwrite error of the Redriver chip, and then sending an alarm signal to the SMbus controller.

6. The method for monitoring a code overwrite error of a Redriver chip according to claim 5, wherein after the Redriver chip loads the parameter information, an ALL_DONE signal is sent to the SMbus controller, the SMbus controller sends an enable signal to the Switch chip to turn Switch on, and the SMbus controller performs data access to the Redriver chip and the EEPROM, and masks the alarm signal of the ADC.

7. The method for monitoring a code overwrite error of a Redriver chip according to claim 5, wherein alarm information sent by the ADC, masked by the SMbus controller, is recorded in a system log during turn-on of the Switch chip.

8. The method for monitoring a code overwrite error of a Redriver chip according to claim 5, wherein the SMbus controller forcibly turns the Switch chip off after receiving the alarm signal during turn-off of the Switch chip.

9. The method for monitoring a code overwrite error of a Red river chip according to claim 5, wherein when the SM bus controller and the ADC are connected via the SMbus, the Switch chip loads ADC sampling data in real time via the SMbus during turn-off after the SM bus controller receives the alarm signal, and the ADC sampling data is parsed and then recorded in a system log.

\* \* \* \* \*